United States Patent
Lin et al.

(10) Patent No.: US 11,818,863 B2
(45) Date of Patent: Nov. 14, 2023

(54) FRAME ASSEMBLY CONFIGURED FOR MOUNTING FANS WITHOUT FASTENERS, FAN ASSEMBLY HAVING THE SAME, AND ELECTRONIC DEVICE HAVING THE SAME

(71) Applicant: Fulian Precision Electronics (Tianjin) Co., LTD., Tianjin (CN)

(72) Inventors: Jia-Feng Lin, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/854,243

(22) Filed: Jun. 30, 2022

(65) Prior Publication Data

US 2023/0171919 A1 Jun. 1, 2023

(30) Foreign Application Priority Data

Nov. 29, 2021 (CN) .......................... 202111434172.6

(51) Int. Cl.
*H05K 7/20* (2006.01)
*F04D 29/52* (2006.01)
*F04D 29/64* (2006.01)

(52) U.S. Cl.
CPC ....... *H05K 7/20172* (2013.01); *F04D 29/522* (2013.01); *F04D 29/646* (2013.01); *H05K 7/20718* (2013.01)

(58) Field of Classification Search
CPC ........... H05K 7/20172; H05K 7/20718; H05K 7/20727; H05K 7/20581; H05K 7/20136; H05K 7/1492; H05K 5/03; F04D 29/522; F04D 29/646; F04D 29/601; G06F 1/20; G06F 1/183; G06F 1/187; G06F 1/184; G06F 1/185; G06F 1/188; G06F 1/189
See application file for complete search history.

(56) References Cited

U.S. PATENT DOCUMENTS

| | | | | |
|---|---|---|---|---|
| 6,316,718 B1 * | 11/2001 | Lin | ..................... | H05K 7/20172 174/17 VA |
| 7,697,287 B2 * | 4/2010 | Yin | ..................... | F04D 25/0613 361/679.48 |
| 8,272,852 B2 * | 9/2012 | Li | ....................... | H05K 7/20727 417/423.15 |
| 8,379,387 B2 * | 2/2013 | Chuang | .............. | H05K 7/20172 415/213.1 |
| 11,612,078 B2 * | 3/2023 | Shih | ................... | H05K 7/20618 |
| 2005/0105269 A1 * | 5/2005 | Chen | .................. | H05K 7/20172 361/695 |

(Continued)

*Primary Examiner* — Abhishek M Rathod
(74) *Attorney, Agent, or Firm* — ScienBiziP, P.C.

(57) ABSTRACT

A frame assembly for holding cooling fans without the use of screws or rivets includes a bottom plate, a frame on the bottom plate, a slider on the frame, a position pin, and a sliding pin. The frame comprises first and second plates, the first plate defining first and second slots extending in different directions. An end of the sliding pin is connected to the slider, other end of the sliding pin is movable within the second slot, and the slider defines a third slot. The orientation of the second slot is such that pushing the assembly against a spring releases the clamping action of the first and second plates on the assembled fans, and releasing the first and second plates allows the fans in the assembly to be reclamped.

20 Claims, 7 Drawing Sheets

(56) References Cited

U.S. PATENT DOCUMENTS

| | | | |
|---|---|---|---|
| 2005/0227608 A1* | 10/2005 | Wu ........................... | G06F 1/20 |
| | | | 454/184 |
| 2009/0009961 A1* | 1/2009 | Li ....................... | H05K 7/20736 |
| | | | 361/679.48 |
| 2010/0232976 A1* | 9/2010 | Li ....................... | H05K 7/20172 |
| | | | 416/244 R |
| 2013/0216374 A1* | 8/2013 | Sun ........................... | G06F 1/20 |
| | | | 415/213.1 |
| 2013/0234000 A1* | 9/2013 | Pang .................. | H05K 7/20172 |
| | | | 248/639 |
| 2020/0146185 A1* | 5/2020 | Wu .................... | H05K 7/20172 |

* cited by examiner

FRAME ASSEMBLY CONFIGURED FOR MOUNTING FANS WITHOUT FASTENERS, FAN ASSEMBLY HAVING THE SAME, AND ELECTRONIC DEVICE HAVING THE SAME

FIELD

The subject matter herein generally relates to heat dissipation, and more particularly, to a frame assembly configured for mounting fans without fasteners, a fan assembly having the same, and an electronic device having the same.

BACKGROUND

An electronic device, such as a server, generates heat during operation. A fan assembly is used in the electronic device to circulate air and remove the generated heat.

The fan assembly may include a plurality of fans which require to be manually fixed to the electronic device by screws or rivets. Such assembly processes are not efficient.

BRIEF DESCRIPTION OF THE DRAWINGS

Implementations of the present technology will now be described, by way of example only, with reference to the attached figures.

DETAILED DESCRIPTION

Figure 1:
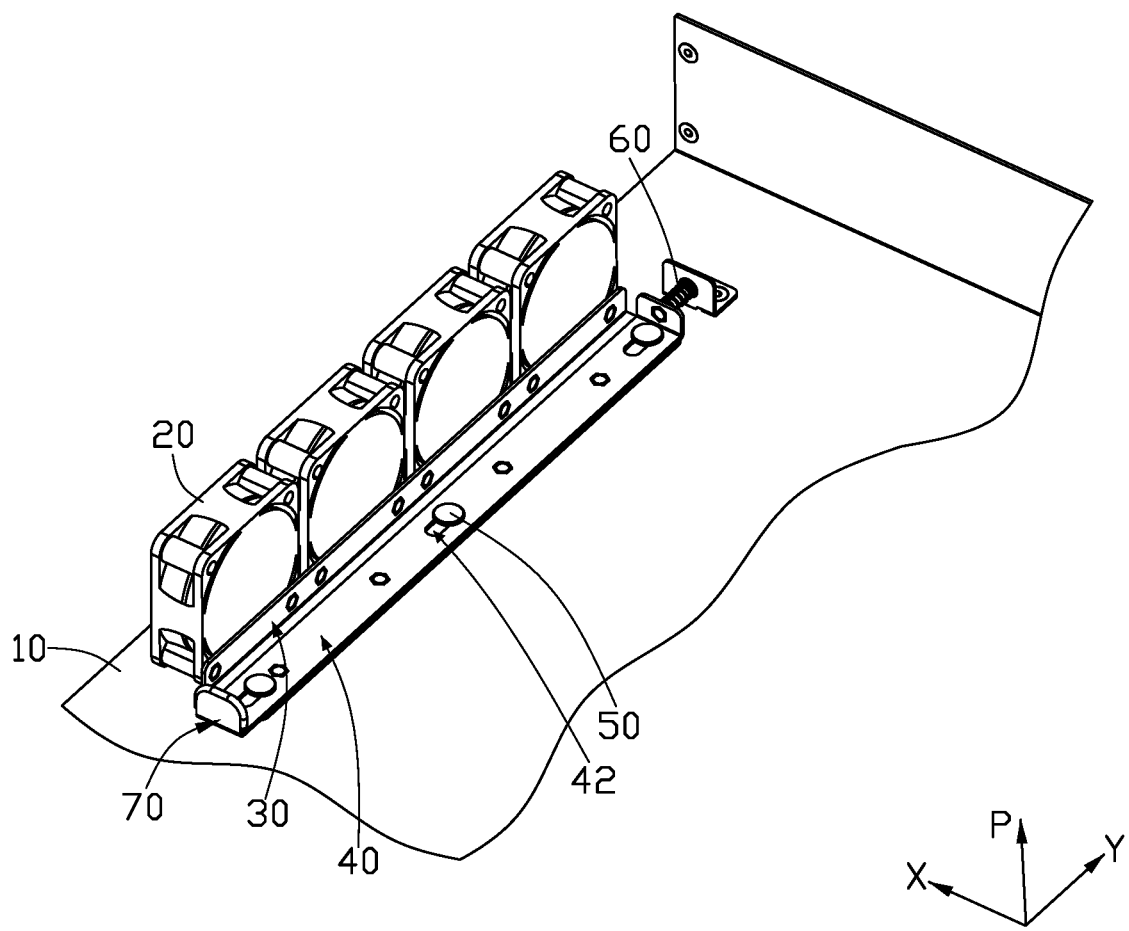
FIG. 1 is a diagrammatic view of a fan assembly according to an embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
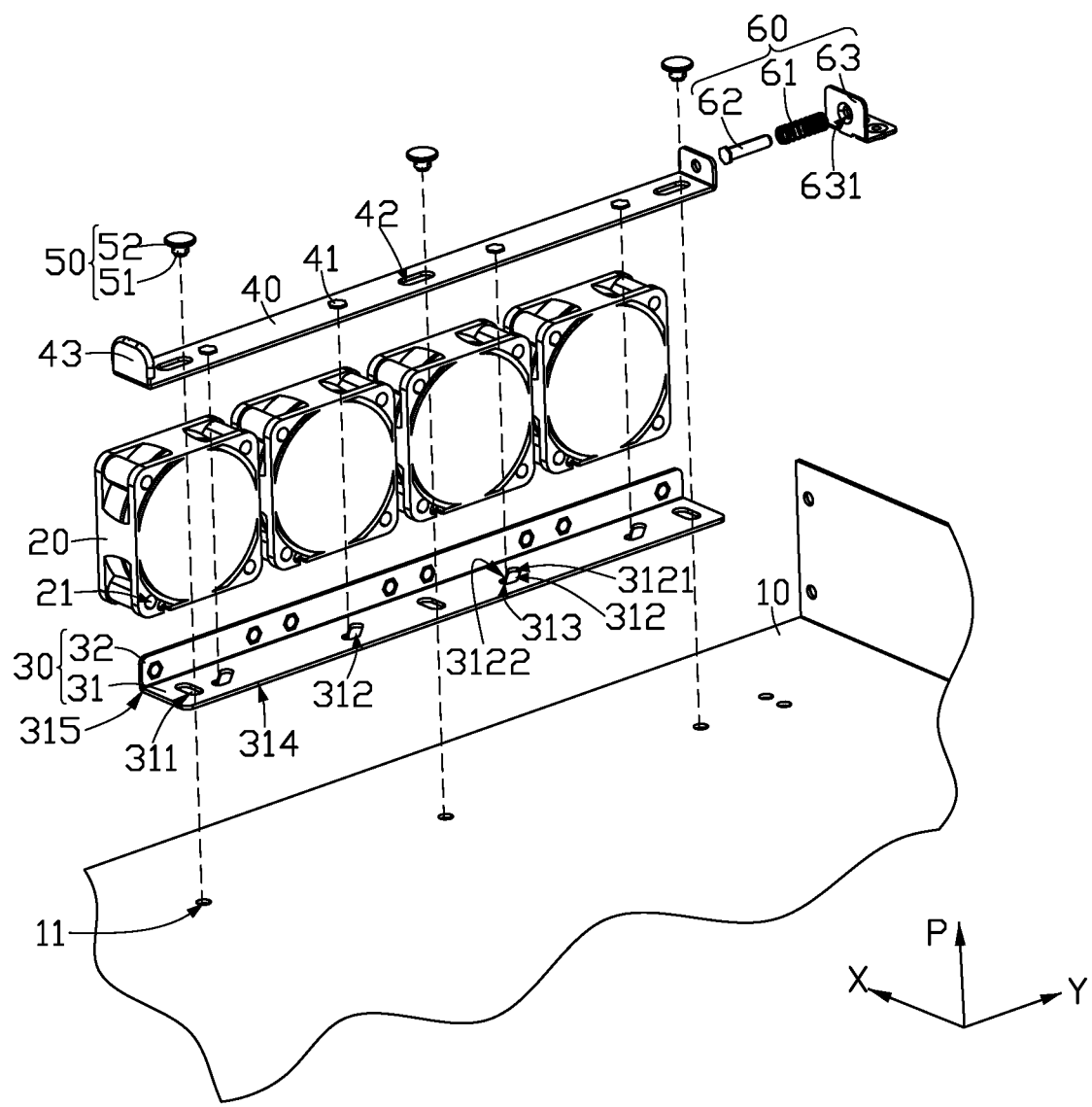
FIG. 2 is an exploded view of the fan assembly of FIG. 1.

Referring to FIGS. 1 and 2, an embodiment of a fan assembly 100 is provided. The fan assembly 100 includes a frame assembly 70 and a plurality of fans 20 connected to the frame assembly 70.

The frame assembly 70 includes a bottom plate 10, a frame 30, a slider 40, a positioning pin 50, and a resetting member 60. The fans 20, the frame 30, the slider 40, the positioning pin 50, and the resetting member 60 are disposed on the bottom plate 10.

The frame 30 includes a first plate 31 and a second plate 32 connected to the first plate 31. The first plate 31 is movably arranged on the bottom plate 10. The first plate 31 includes a first side 314 and a second side 315 opposite to the first side 314. The second plate 32 is connected to the second side 315. The fans 20 are disposed on a surface of the second plate 32 away from the first plate 31.

Referring to FIG. 2, the first plate 31 defines a plurality of first slots 311 and a plurality of second slots 312. A first direction X is defined as a direction from the first side 314 to the second side 315. The first slots 311 extend along the first direction X. The second slots 312 extend along a direction (not shown) inclined with respect to first direction X.

Figure 3:
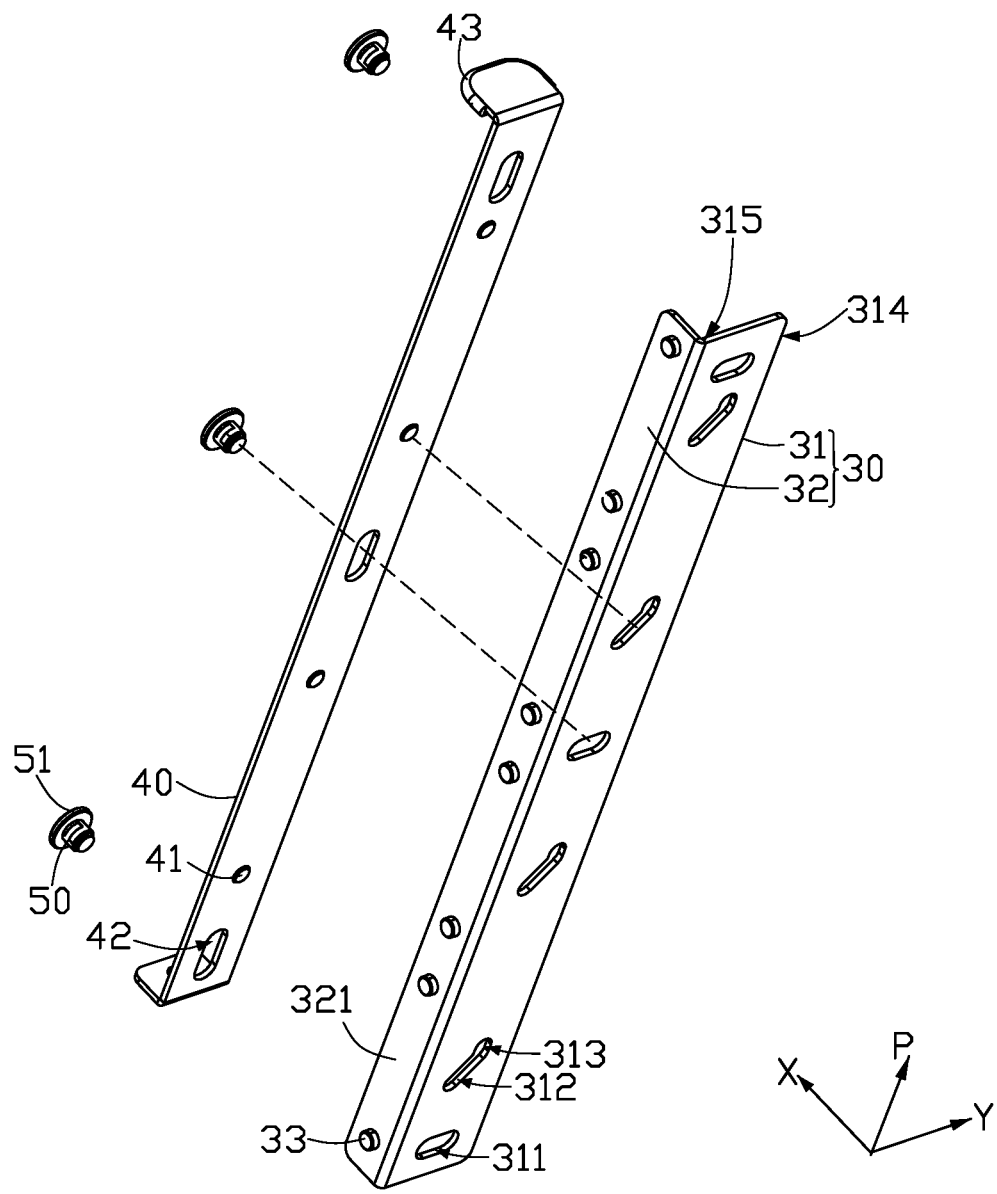
FIG. 3 is a diagrammatic view of a frame and a slider of the fan assembly of FIG. 2.

Referring to FIGS. 2 and 3, the slider 40 is disposed on the first plate 31, and the first plate 31 is movably disposed between the slider 40 and the bottom plate 10. The fan assembly 100 further includes a sliding pin 41 connected to the frame 40, and a portion of the sliding pin 41 is accommodated inside the second slot 312. A second direction Y is defined as a direction along which the first plate 31 extends. The slider 40 defines a third slot 42 that extends along the second direction Y. The third slot 42 corresponds to the first slot 311.

Figure 4:
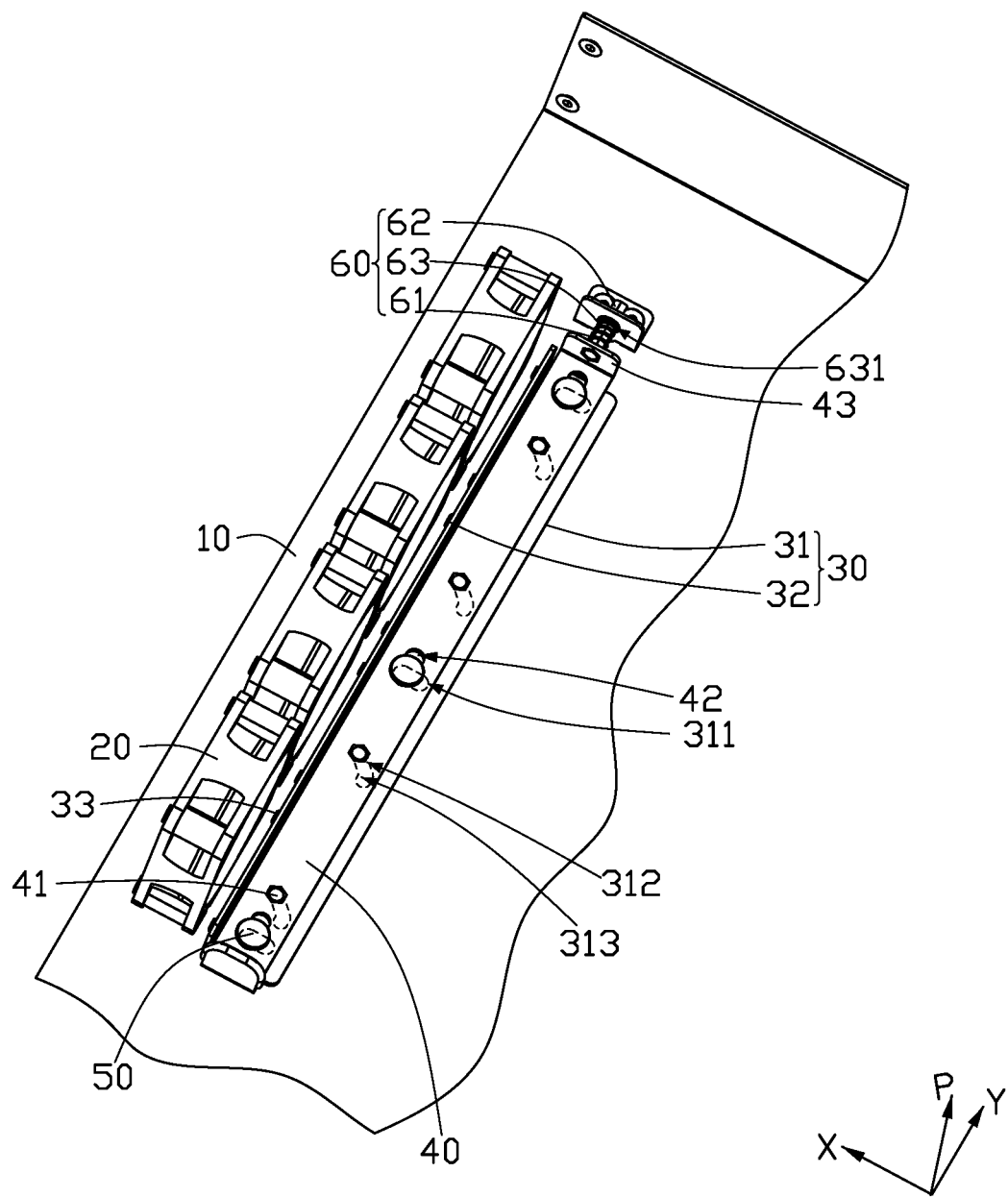
FIG. 4 is similar to FIG. 1, but showing a fan separated from a frame of the frame assembly.

Referring to FIGS. 2, 3 and 4, the bottom plate 10 defines a through hole 11. An end of the positioning pin 50 is disposed within the through hole 11, and other end of the positioning pin 50 goes through the third slot 42 and the first slot 311. The slider 40 can be pushed along the second direction Y, and the sliding pin 41 moves inside the second slot 312 to cause the first plate 31 to move along the first direction X. Thus, the second plate 32 will move towards or away from the fans 20, which allows easy assembly and disassembly of the fans 20 to or from the second plate 32. In some embodiments, the first slot 311 and the third slot 42 are in the shape of a flattened circle. In other embodiments, the first slot 311 is not limited to extending along the first direction X, and the third slot 42 is not limited to extending along the second direction Y. In the present disclosure, the first slot 311 and the third slot 42 extend in different directions, and the first slot 311 and the second slot 312 extend in different directions. As such, whichever direction the slider 40 moves in, the frame 30 will move along a different direction.

Referring to FIGS. 2 and 3, the positioning pin 50 includes a pin body 51 and a pin nut 52 connected to an end of the pin body 51. A third direction P is perpendicular to the first direction X and to the second direction Y. A forward projection (not shown) of the pin nut 52 along the third direction P covers the first slot 311 and the third slot 42. The pin body 51 goes through the third slot 42 and the first slot 311, and is connected to the bottom plate 10. The pin nut 52 resists against a surface of the first plate 31. A length of the pin body 51 is bigger than a sum of the thicknesses of the first plate 31 and the slider 40. Thus, the frame 30 and the slider 40 are connected to the bottom plate 10, and the slider 40 is able to move relative to the frame 30.

Referring to FIGS. 2, 3 and 4, the fan assembly 100 further includes a push plate 43 connected to an end of the frame 40. The push plate 43 is substantially perpendicular to the frame 40. A user can push the push plate 43 to move along the second direction Y, thereby achieving the assembly or disassembly the fan assembly 100.

The resetting member 60 is connected to the push plate 43. The resetting member 60 includes an elastic member 61, a guider 62, and a stopper 63. The stopper 63 is fixed on the bottom plate 10 and spaced from the push plate 43. The stopper 63 defines a hole 631. An end of the guider 62 is disposed inside the hole 631, and other end of the guider 62 is connected to the push plate 43. The guider 62 extends along the second direction Y. The elastic member 61 is disposed around the guider 62. One end of the elastic member 61 resists against the push plate 43, and other end of the elastic member 61 resists against the stopper 63. When the push plate 43 is pushed away from the stopper 63 along the guider 62, the elastic member 61 is compressed and resists against the stopper 63 and the push plate 43. When the push plate 43 is not pushed, the elastic member 61 rebounds and pushes the push plate 43 back to its original position near the stopper 63. In some embodiments, the elastic member 61 is a spring.

Figure 5:
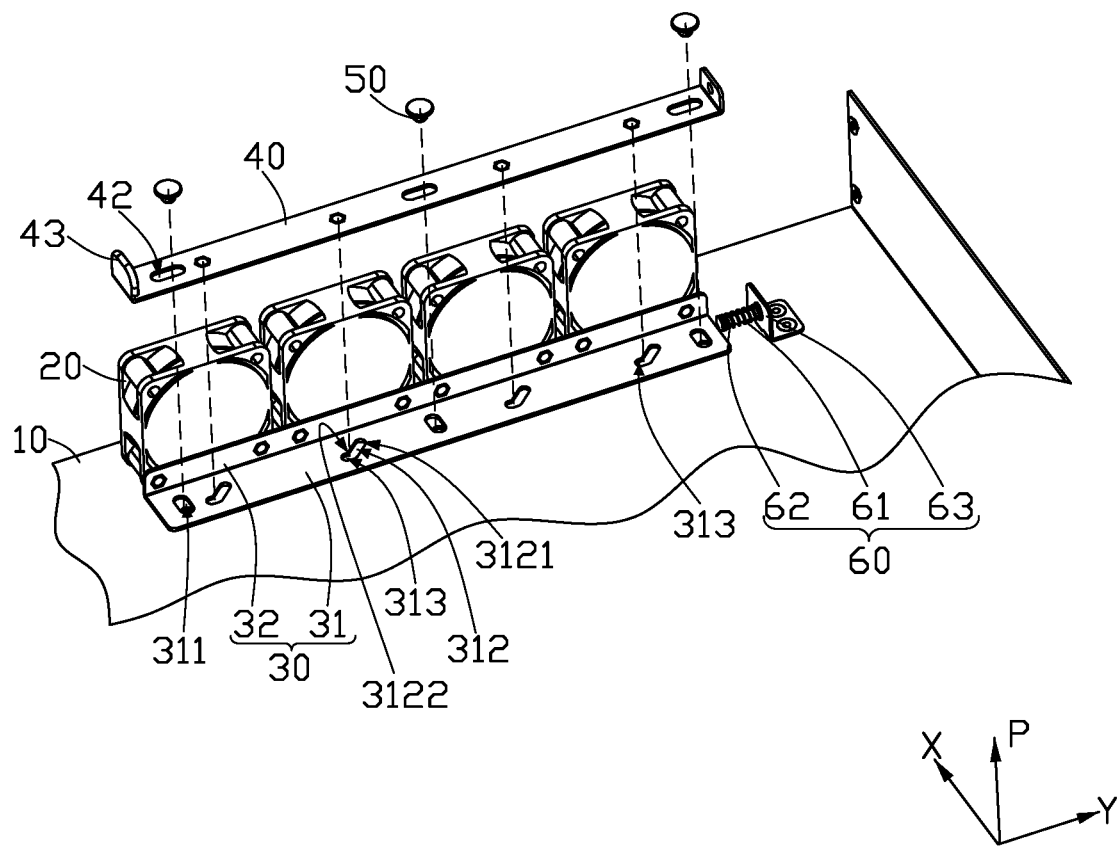
FIG. 5 is another exploded view of the fan assembly of FIG. 1.

Referring to FIGS. 4 and 5, the second slot 312 includes a first end 3121 and a second end 3122 opposite to the first end 3121. The first end 3121 is closer to the resetting member 60 compared to the second end 3122, which means that a distance (not shown) between the first end 3121 and the resetting member 60 is less than a distance (not shown) between the second end 3122 and the resetting member 60. The first plate 31 defines a stop groove 313 connected to the second end 3122. The stop groove 313 extends along the second direction Y, and accommodates the sliding pin 41. In some embodiments, along the first direction X, a width of the stop groove 313 is similar to a diameter of sliding pin 41, so that the sliding pin 41 is firmly accommodated inside the stop groove 313.

Referring to FIGS. 4 and 5, when the fan assembly 100 is to be assembled, the slider 40 is first pushed towards the resetting member 60, until the sliding pin 41 is disposed inside the first end 3121, as shown in FIG. 4. Then, the fans 20 are disposed on the side of the second plate 32 away from the first plate 31. The fans 20 are spaced from the second plate 32. Then, the slider 40 moves away from the resetting member 60 along the second direction Y, until the sliding pin 41 is disposed inside the stop groove 313. Meanwhile, the second plate 32 moves towards the fans 20 along the first direction X, until the second plate 32 acts to clamp the fans 20. Thus, the fans 20 are assembled to the frame 30 to obtain the fan assembly 100.

Referring to FIGS. 2, 3 and 4, the fan 20 defines a mounting hole 21. The second plate 32 includes a plate body 321 and a mounting pin 33. The first plate 31 is vertically connected to a surface of the plate body 321. The mounting pin 33 is connected to another surface of the plate body 321. The mounting pin 33 faces the mounting hole 21. When the second plate 32 moves towards the fans 20, the mounting pin 33 is inserted into the mounting hole 21. Thus, stability of attachment between the fan 20 and the frame 30 is improved.

Figure 6:
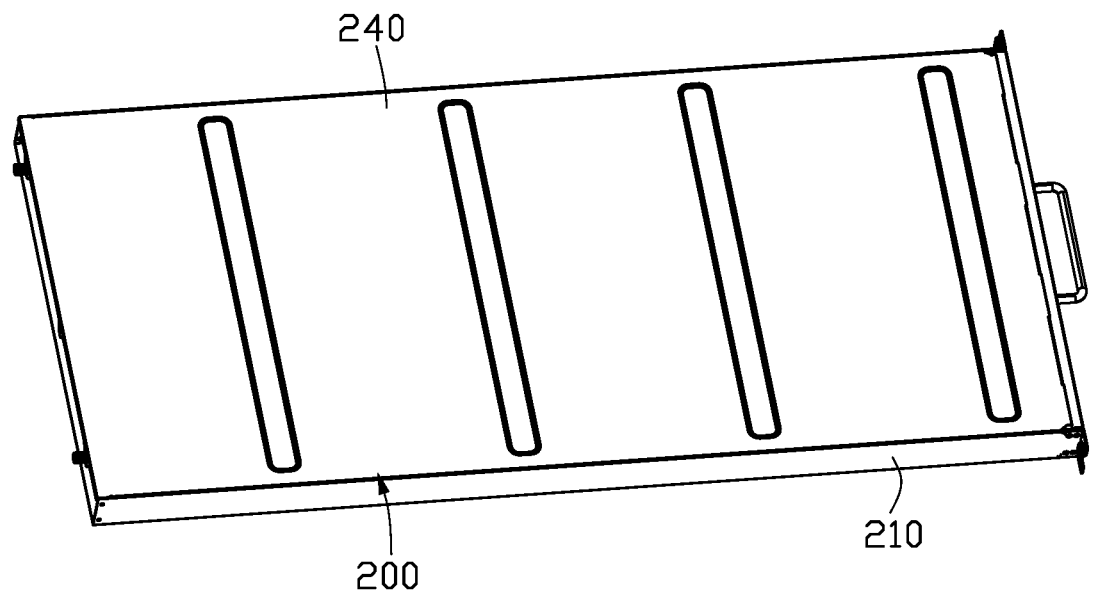
FIG. 6 is a diagrammatic view of an electronic device according to an embodiment of the present disclosure.
Figure 7:
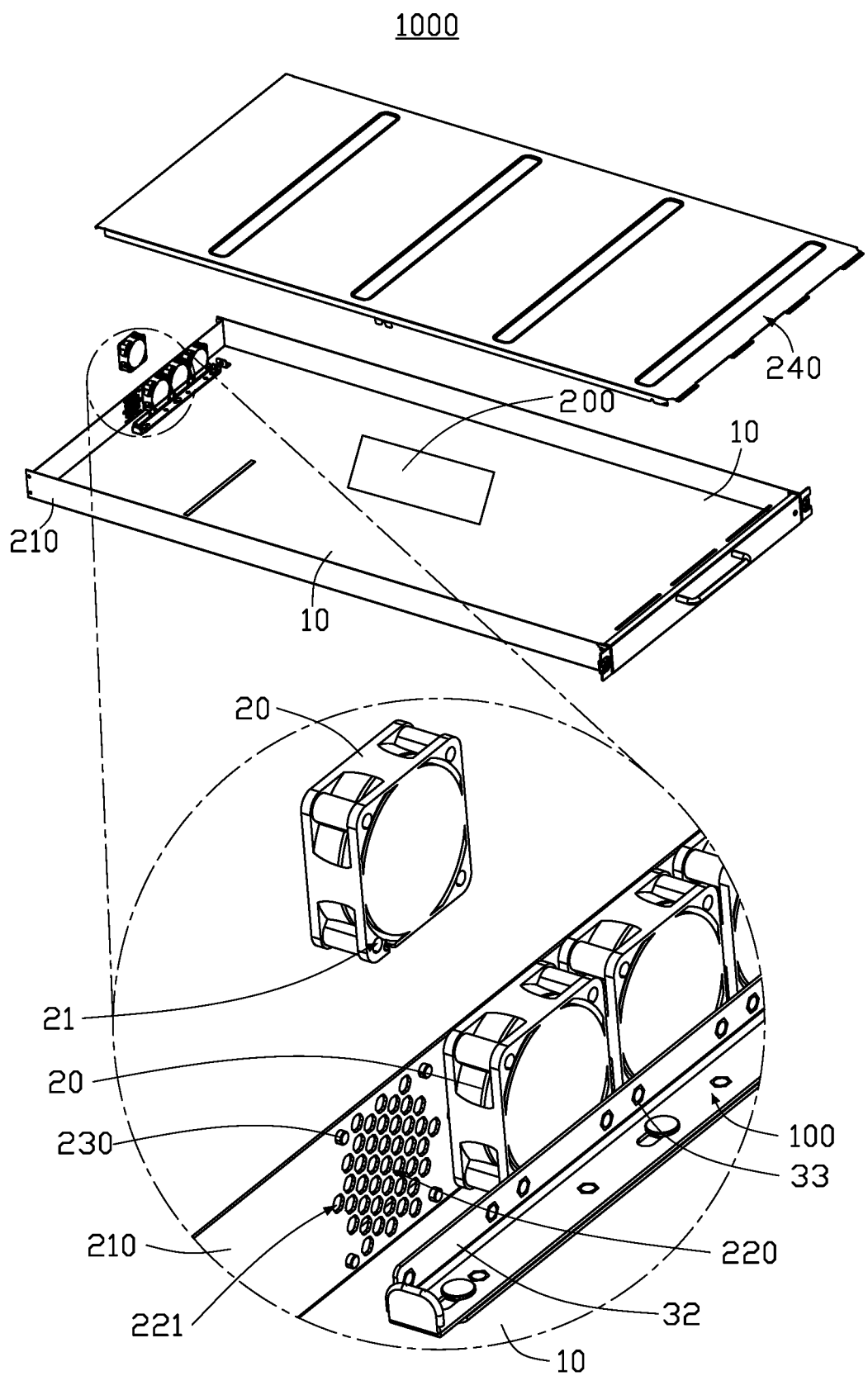
FIG. 7 is an exploded view of the electronic device of FIG. 6.

Referring to FIGS. 6 and 7, an embodiment of an electronic device 1000 is provided. The electronic device 1000 includes a housing 200, an electronic component 300, and the fan assembly 100. The electronic component 300 is a server. In other embodiments, the electronic component 300 can also be a computer or a frequency converter or other components generates heat.

Referring to FIGS. 6 and 7, the housing 200 includes a side plate 210 and a cover plate 240. The bottom plate 10 is connected to the side plate 210. The cover plate 240 is connected to the side plate 210. The bottom plate 10, the cover plate 240, and the side plate 210 cooperatively define a receiving space R. The fans 20 and electronic component 300 are disposed within the receiving space R. The fans 20 cause circulation of the air to remove heat from the electronic component 300.

Referring to FIGS. 6 and 7, the side plate 210 is divided into a plurality of regions 220. Each of the regions 220 defines a plurality of heat dissipation holes 221. The fans 20 face the heat dissipation holes 221, so that heat gathered is dissipated by the fans 20 to an ambient environment.

Referring to FIGS. 6 and 7, the housing 200 further includes a plurality of fix pins 230. The fix pins 230 are connected to the side plate 210 and face the fan 20. The fix pins 230 go into the mounting hole 21 of the fan 20. Thus, a connection stability between the fan 20 and the side plate 210 is improved.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A frame assembly configured for mounting fans without fasteners, the frame assembly comprising:
 a bottom plate;
 a frame movably disposed on the bottom plate;
 a slider movably disposed on the frame;
 a positioning pin; and
 a sliding pin;
wherein the frame comprises a first plate and a second plate connected to the first plate, the first plate defines a first slot and a second slot, the first slot and the second slot extend in different directions;
an end of the sliding pin is connected to the slider, another end of the sliding pin is movably arranged within the second slot, the slider defines a third slot, the third slot and the first slot extend in different directions;
an end of the positioning pin is fixed on the bottom plate, other end of the positioning pin movably extends through the first slot and the third slot.

2. The frame assembly of claim 1, wherein the first plate comprises a first side and a second side opposite to the first side, the second plate is connected to the second side; a first direction is defined as a direction from the first side to the second side and a second direction is perpendicular to the first direction, the first slot extends along the first direction, the third slot extends along the second direction, the second slot extends in a direction inclined to the first direction and the second direction.

3. The frame assembly of claim 2, wherein a third direction is perpendicular to the first direction and the second direction, the positioning pin comprises a pin body and a pin nut, the pin nut is connected to an end of the pin body, a projection of the pin nut in the third direction covers the first slot and the third slot.

4. The frame assembly of claim 2, further comprising a resetting member and a push plate, wherein the push plate is connected to an end of the slider, the resetting member is connected between the push plate and the bottom plate, the resetting member is configured for driving the slider to move relative to the frame.

5. The frame assembly of claim 4, wherein the resetting member comprises an elastic member, a guider, and a stopper, the guider is arranged between the push plate and the stopper along the first direction, the stopper is disposed on the bottom plate, the elastic member is sleeved on the guider, an end of the elastic member resists against the push plate, another end of the elastic member resists against the stopper.

6. The frame assembly of claim 4, wherein the first slot comprises a first end and a second end opposite to the first end, a distance between the first end and the resetting member is less than a distance between the second end and the resetting member.

7. The frame assembly of claim 6, wherein the first plate further defines a stop groove, the stop groove is connected to the second end, the stop groove extends along the second direction.

8. The frame assembly of claim 7, wherein in the first direction, a width of the stop groove is equal to a width of the sliding pin.

9. A fan assembly comprising:
a frame assembly; and
a plurality of fans connected to the frame assembly;
wherein the frame assembly comprises:
a bottom plate;
a frame movably disposed on the bottom plate;
a slider movably disposed on the frame;
a positioning pin; and
a sliding pin;
the frame comprises a first plate and a second plate connected to the first plate, the first plate defines a first slot and a second slot, the first slot and the second slot extend in different directions, the second plate defines a plurality of mounting pins;
an end of the sliding pin is connected to the slider, another end of the sliding pin is movably arranged within the second slot, the slider defines a third slot, the third slot and the first slot extend in different directions;
an end of the positioning pin is fixed on the bottom plate, another end of the positioning pin movably extends through the first slot and the third slot;
each of the plurality of fans defines a mounting hole, the plurality of mounting holes faces the plurality of mounting pins.

10. The fan assembly of claim 9, wherein the first plate comprises a first side and a second side opposite to the first side, the second plate is connected to the second side; a first direction is defined as a direction from the first side to the second side and a second direction is perpendicular to the first direction, the first slot extends along the first direction, the third slot extends along the second direction, the second slot extends in a direction inclined with respect to the first direction and the second direction.

11. The fan assembly of claim 9, wherein a third direction is perpendicular to the first direction and the second direction, the positioning pin comprises a pin body and a pin nut, the pin nut is connected to an end of the pin body, a projection of the pin nut in the third direction covers the first slot and the third slot.

12. The fan assembly of claim 10, further comprising a resetting member and a push plate, wherein the push plate is connected to an end of the slider, the resetting member is connected between the push plate and the bottom plate, the resetting member is configured for driving the slider to move in relative to the frame.

13. The fan assembly of claim 12, wherein the resetting member comprises an elastic member, a guider, and a stopper, the guider is arranged between the push plate and the stopper along the first direction, the stopper is disposed on the bottom plate, the elastic member is sleeved on the guider, an end of the elastic member resist against the push plate, another end of the elastic member resist against the stopper.

14. The fan assembly of claim 12, wherein the first slot comprises a first end and a second end, the first end is connected to the second end, a distance between the first end and the resetting member is less than a distance between the second end and the resetting member.

15. The fan assembly of claim 14, wherein the first plate further defines a stop groove, the stop groove is connected to the second end, the stop groove extends along the second direction.

16. The fan assembly of claim 15, wherein along the first direction, the section width of the stop groove is equal to the section width of the sliding pin.

17. The fan assembly of claim 9, wherein the second plate includes a plate body and a mounting pin, the first plate is connected to a surface of the plate body vertically, the mounting pin is connected to another surface of the plate body.

18. An electronic device comprising:
a housing;
an electronic component disposed in the housing;
a fan assembly disposed in the housing;
wherein the frame assembly comprises
a plurality of fans and a frame assembly connected to the plurality of fans, the frame assembly comprises:
a frame assembly; and
a plurality of fans connected to the frame assembly;
wherein the frame assembly comprises:
a bottom plate;
a frame movably disposed on the bottom plate;
a slider movably disposed on the frame;
a positioning pin; and
a sliding pin;
the frame comprises a first plate and a second plate connected to the first plate, the first plate defines a first slot and a second slot, the first slot and the second slot extend in different directions, the second plate defines a plurality of mounting pins;
an end of the sliding pin is connected to the slider, another end of the sliding pin is movably arranged within the second slot, the slider defines a third slot, the third slot and the first slot extend in different directions;
an end of the positioning pin is fixed on the bottom plate, another end of the positioning pin movably extends through the first slot and the third slot;
each of the plurality of fans defines a mounting hole, the plurality of mounting holes faces the plurality of mounting pins.

19. The electronic device of claim 18, wherein the housing comprises a side plate and a cover plate, the side plate, the cover plate, the bottom plate, and the cover plate cooperatively define a receiving groove, the electronic component and the fan assembly is disposed within the receiving groove.

20. The electronic device of claim 19, wherein the housing further comprises a plurality of fix pins, the plurality of fix pins corresponds to the receiving groove and is connected to side plate, the plurality of fix pins is inserted into the plurality of mounting holes, the side plate defines a plurality of heat dissipation holes, the plurality of fans faces the plurality of heat dissipation holes.

\* \* \* \* \*